(12) United States Patent
Kim et al.

(10) Patent No.: US 10,950,193 B2
(45) Date of Patent: Mar. 16, 2021

(54) DISPLAY APPARATUS WITH TOUCH SENSOR

(71) Applicant: LG Display Co., Ltd., Seoul (KR)

(72) Inventors: Jaeseung Kim, Gyeonggi-do (KR); HwiDeuk Lee, Gyeongsangbuk-do (KR); Yangsik Lee, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/510,257

(22) Filed: Jul. 12, 2019

(65) Prior Publication Data

US 2020/0027416 A1 Jan. 23, 2020

(30) Foreign Application Priority Data

Jul. 19, 2018 (KR) .................. 10-2018-0084393

(51) Int. Cl.
| | |
|---|---|
| *G09G 3/36* | (2006.01) |
| *G02F 1/1345* | (2006.01) |
| *G09G 3/3208* | (2016.01) |
| *H01L 29/786* | (2006.01) |
| *G06F 3/041* | (2006.01) |

(52) U.S. Cl.
CPC ......... *G09G 3/3648* (2013.01); *G02F 1/1345* (2013.01); *G06F 3/041* (2013.01); *G09G 3/3208* (2013.01); *H01L 29/78645* (2013.01); *G09G 2300/0439* (2013.01); *G09G 2300/0809* (2013.01)

(58) Field of Classification Search
CPC ............... G09G 3/3648; G09G 3/3208; G09G 2300/0809; G09G 2300/0439; G09G 3/20; H01L 29/78645; H01L 27/124; G06F 3/041; G06F 1/1345; G06F 3/04166; G06F 3/0446; G06F 3/0445; G06F 3/0443; G06F 3/0416; G02F 1/13338; G02F 1/1345
See application file for complete search history.

(56) References Cited

U.S. PATENT DOCUMENTS

| | | | |
|---|---|---|---|
| 2015/0277651 A1* | 10/2015 | Zhang | G06F 3/041 |
| | | | 345/173 |
| 2015/0364117 A1 | 12/2015 | Azumi et al. | |
| 2016/0179258 A1* | 6/2016 | Fan | G06F 3/044 |
| | | | 345/173 |
| 2017/0090637 A1* | 3/2017 | Yoon | G06F 3/0414 |

(Continued)

FOREIGN PATENT DOCUMENTS

CN 105573543 B 2/2019

OTHER PUBLICATIONS

Combined Search and Examination Report dated Jan. 10, 2020 issued in United Kingdom Patent Application No. 1910365.4 (6 pages).

*Primary Examiner* — Premal R Patel
(74) *Attorney, Agent, or Firm* — Polsinelli PC

(57) ABSTRACT

A display apparatus includes a substrate including an active area where a plurality of pixels is connected to gate lines and data lines intersecting with each other, and a non-active area where a plurality of lines for transmitting signals for driving the plurality of pixels is disposed; a touch signal generation circuit disposed on the non-active area, receiving a touch clock signal and outputting a touch driving signal; and a touch sensor part receiving the touch driving signal and generating touch information on a touch point at the active area.

18 Claims, 15 Drawing Sheets

(56) References Cited

U.S. PATENT DOCUMENTS

| | | | |
|---|---|---|---|
| 2017/0108987 A1* | 4/2017 | Park | G06F 3/044 |
| 2017/0115808 A1* | 4/2017 | Cho | G06F 3/0412 |
| 2017/0153735 A1* | 6/2017 | Lee | G02F 1/13439 |
| 2017/0153747 A1* | 6/2017 | Yoon | G02F 1/1343 |
| 2017/0193943 A1* | 7/2017 | Cao | G09G 3/36 |
| 2018/0074629 A1 | 3/2018 | Lee et al. | |
| 2018/0095575 A1 | 4/2018 | Ota et al. | |
| 2019/0196619 A1* | 6/2019 | Baek | G06F 3/04166 |
| 2019/0302959 A1* | 10/2019 | Clark | G06F 3/0412 |

* cited by examiner

FIG.9
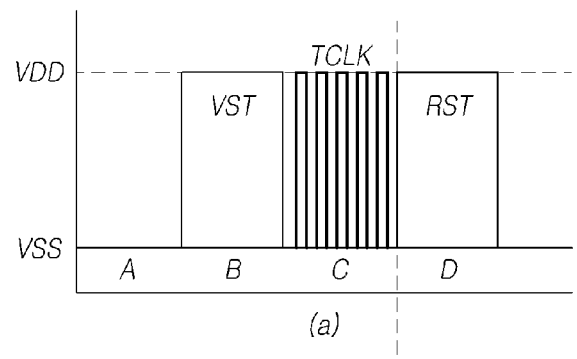
(a)
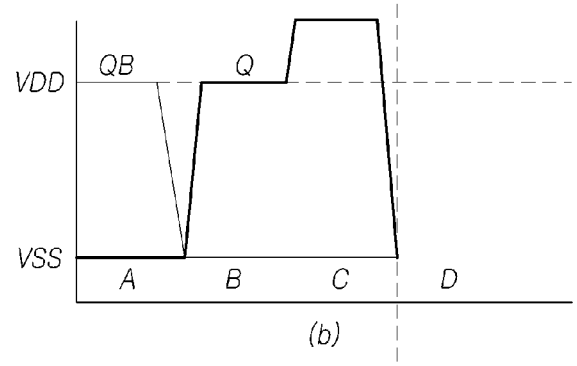
(b)
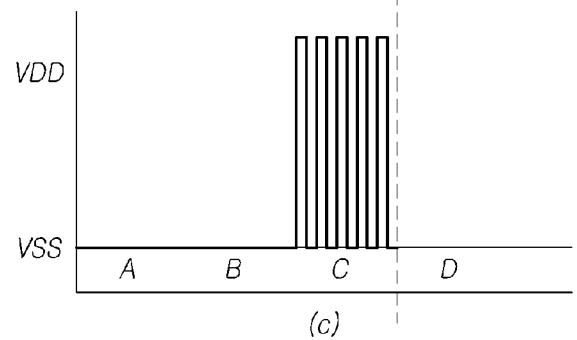
(c)

DISPLAY APPARATUS WITH TOUCH SENSOR

CROSS REFERENCE TO RELATED APPLICATION

This application claims priority from Korean Patent Application No. 10-2018-0084393, filed on Jul. 19, 2018, which is hereby incorporated by reference in its entirety.

BACKGROUND

Field of the Disclosure

The present disclosure relates to a display apparatus having a touch sensor.

Description of the Background

As the information society develops, the demand for display devices for displaying images is increasing in various forms. Various types of display devices such as a liquid crystal display device (LCD), a plasma display device, and an organic light emitting display device (OLED) have been used for this purpose.

The organic light emitting display device among these display devices has self-emission characteristics and has excellent response speed, viewing angle and color reproducibility, and can be manufactured to be thin.

The display device may operate in response to an input signal received through various input devices such as a keyboard and a mouse. The display device can input a user's command intuitively and conveniently by touching the screen using the touch panel. The touch panel may be disposed on the screen of the display device and allows the user to input a command of the user by touching a specific point on the screen of the display device. Such a touch panel may be embedded in the display device and integrated with the display device. The touch panel integrated in the display device may be referred to as a touch sensor.

The touch sensor includes a plurality of touch electrodes, and the touch electrodes can receive the touch driving signal through the touch lines and output the touch sensing signal. In recent years, due to the increase tendency in the size of the display device, the number of touch electrodes disposed on the display device may increase, so that the number of touch lines for transmitting the touch driving signals to the touch electrodes should be increased. As a result, the number of touch driving signals outputted from the touch IC also increases. In addition, a plurality of touch driving signals may be simultaneously output to sense touches occurring at various points on the display device. As a result, since the touch driving circuit should output a large number of touch driving signals, there may arise a problem that the size of the touch driving circuit increases.

SUMMARY

The present disclosure is to provide a display device including a touch sensor capable of reducing the size of the touch control circuit.

Also, the present disclosure is to provide a display device having a touch sensor capable of reducing manufacturing cost.

Further, the present disclosure is to provide a display device including a thin touch sensor.

In accordance with an aspect of the present disclosure, there may be provided with a display apparatus including: a substrate including an active area in which pixels connected to gate lines and data lines intersecting with each other are disposed, and a non-active area in which lines for transmitting signals for driving the plurality of pixels are disposed; a touch signal generation circuit which is disposed on the non-active area and receives a touch clock signal and outputs a touch driving signal; and a touch sensor part for receiving the touch driving signal and generating touch information about a touch point on the active area.

In accordance with another aspect of the present disclosure, there may be provided with a display device including: a display panel including an active area in which a gate line and a data line are disposed and which includes a plurality of pixels arranged in a region where the gate line and the data line intersect with each other, and a non-active area in which a touch signal generation circuit for receiving a touch clock signal and outputting a touch signal is disposed; a display drive circuit for supplying a gate signal applied to the gate line and a driving signal corresponding to a data signal applied to the data line; a touch sensor part including a plurality of touch electrodes for receiving the touch signal from the touch signal generation circuit and generating information about touch points on the display panel; and a touch driver circuit for supplying the touch clock signal to the touch signal generation circuit.

The display apparatus may further includes a gate signal generation circuit for receiving the driving signal from the display drive circuit and generating the gate signal.

According to these aspects, it is possible to provide the display device having the touch sensor capable of correctly recognizing a touch by inducing a change in capacitance of a surrounding point.

According to the aspects, it is possible to provide the display device having the touch sensor capable of reducing the size of the touch control circuit.

According to the aspects, it is possible to provide the display device having the touch sensor capable of reducing manufacturing cost.

According to the aspects, it is possible to provide the display device including a thin touch sensor.

BRIEF DESCRIPTION OF THE DRAWINGS

The above and other aspects, features and advantages of the present disclosure will be more apparent from the following detailed description taken in conjunction with the accompanying drawings, in which:

FIG. 9 is a timing chart illustrating the first aspect of the operation of the touch signal generator shown in FIG. 8;

DETAILED DESCRIPTION

Figure 1:
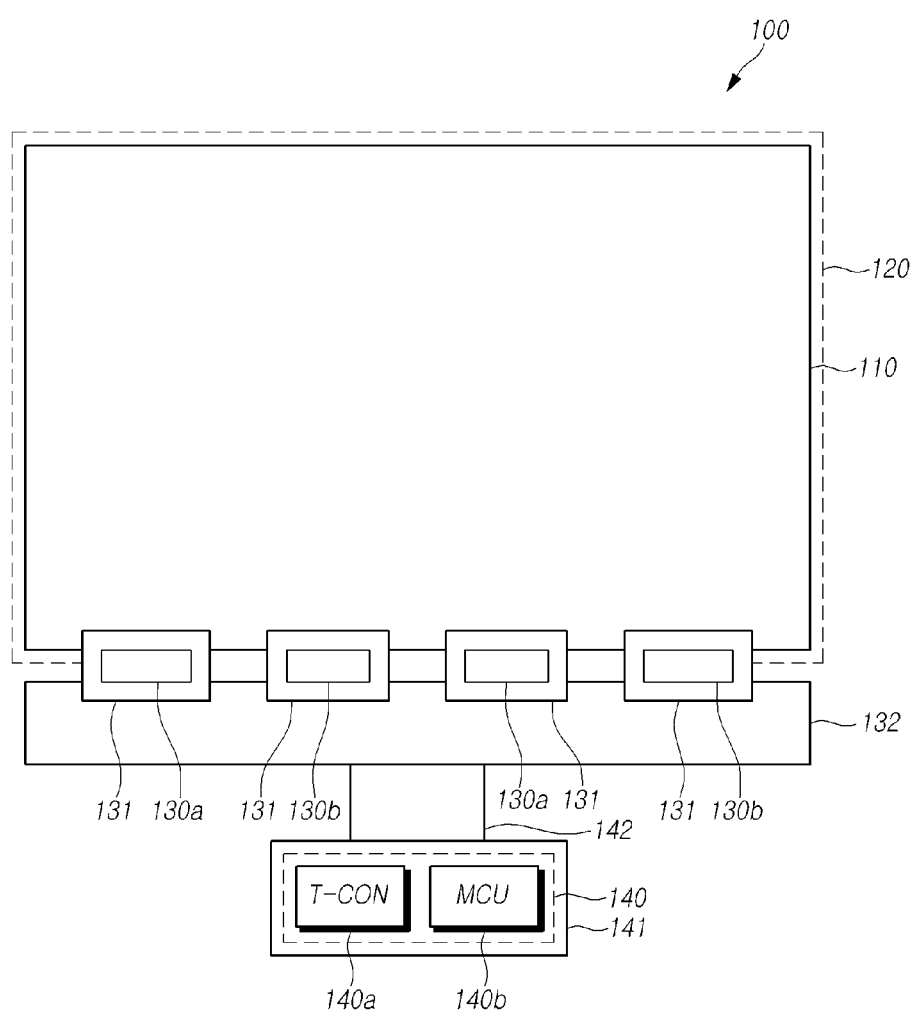
FIG. 1 is a structural diagram illustrating an aspect of the display apparatus having the touch sensor part according to the present disclosure.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Figure 2:
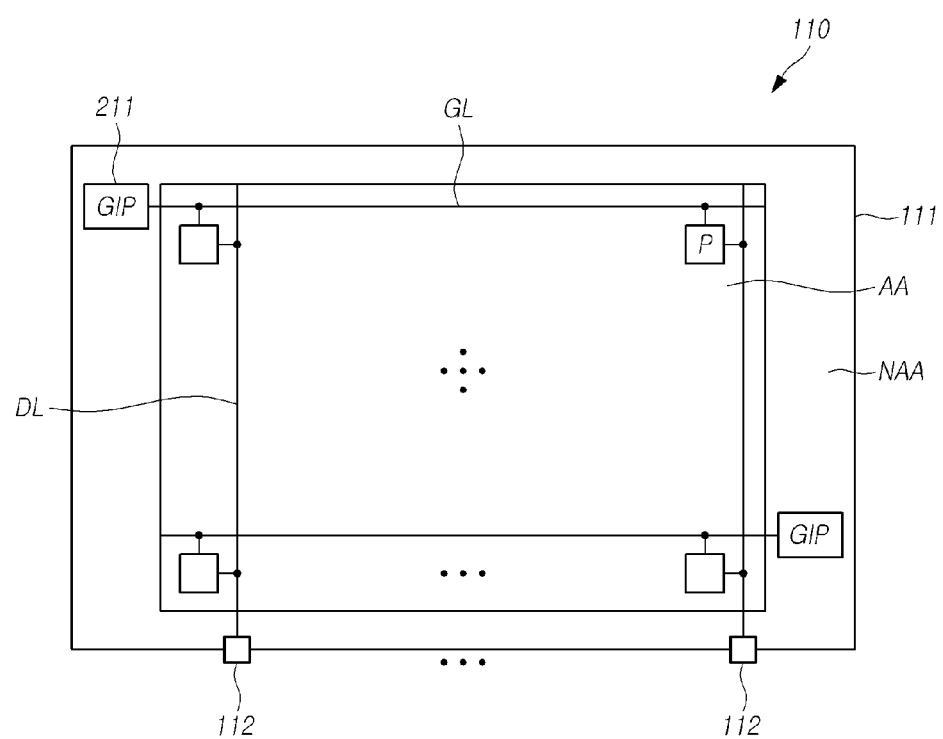
FIG. 2 is a plan view illustrating an aspect of the display panel shown in FIG. 1.

FIG. 1 is a structural diagram illustrating an aspect of the display apparatus having the touch sensor part according to the present aspect, and FIG. 2 is a plan view illustrating one aspect of the display panel shown in FIG. 1.

Referring to FIG. 1 and FIG. 2, the display device 100 may include the display panel 110 for displaying an image, the display drive circuit 130a for supplying the driving signal corresponding to the gate signal applied to the gate line (GL) and the data signal applied to the data line (DL), the touch sensor part 120 including a plurality of touch electrodes for receiving touch signals from the touch signal generation circuit and generating information about touch points on the display panel 110, and the touch drive circuit 130b for supplying a touch clock signal to the touch signal generation circuit. Also, the display device 100 may include a controller or a control circuit 140 for controlling the display drive circuit 130a and the touch drive circuit 130b. The display drive circuit 130a, the touch drive circuit 130b, and the control circuit 140 may be implemented as an integrated circuit, but may be not limited thereto. The display device 100 may be a liquid crystal display device or an organic light emitting display device, but is not limited thereto.

The display panel 110 may include an active area (AA) and a non-active area (NAA) disposed on the substrate 111. The active area (AA) may be disposed at the center of the substrate 111 and the non-active area (NAA) may be formed at the edge of the substrate 111, but may be not limited thereto. A plurality of gate lines (GL) and a plurality of data lines (DL) are arranged so as to intersect with each other, and a plurality of subpixels (P) may be arranged in a region where the plurality of gate lines (GL) intersect with the plurality of data lines (DL). In the case that the display device 100 is an organic light emitting display device, each subpixel (P) of the display panel 110 may include a light emitting element and a pixel circuit (not shown) for supplying a driving current to the light emitting element. The light emitting element may be an organic light emitting diode (OLED), but is not limited thereto. The organic light emitting diode may include the organic layer, and an anode electrode and a cathode electrode through which current flows in the organic layer. The pixel circuit may be connected to a power source or lines for transmitting a signal. The pixel circuit may be connected to the gate line (GL) for transferring the gate signal and the data line (DL) for transferring the data signal. Furthermore, the pixel circuit may receive the data signal in response to the gate signal, and may generate the driving current and supply the driving current to the light emitting element. In addition, the pixel circuit may be connected to a separate power line (not shown) to receive the driving current. The touch electrode may be disposed on the upper portion of the active area (AA). A gate-in panel (GIP) may be disposed in the non-active area (NAA), and the gate-in-panel (GIP) may transmit the gate signal to the pixel in response to the signal received from the circuit unit shown in FIG. 1. A power line, a clock line, the gate line (GL), a data line (DL) and a touch line may be disposed in the non-active area (NAA), however, the present disclosure is not limited thereto. Furthermore, in the non-active area (NAA), the light emitting layer and the cathode electrode included in the pixel may be disposed. Herein, the active area (AA) and the non-active area (NAA) may also be expressed as a display area and a non-display area, respectively.

The pad 112 may be disposed under the non-active area (NAA) of the substrate 111, as shown in FIG. 2. The pad 112 may be connected to the output terminals of the display driver circuit 130a and the touch driver circuit 130b, respectively. An area where the pads 112 are arranged on the substrate 111 may be referred to as a pad area. The pad 112 is illustrated to be connected to the data line DL, but is not limited thereto. The pad 112 may be disposed corresponding to all the lines for transmitting and receiving to and from the display driver circuit 130a and the touch driver circuit 130b shown in FIG. 1.

The display drive circuit 130a may receive a data control signal so as to generate a data signal, and may receive a gate control signal so as to output a gate signal. When the gate signal generation circuit 211 is disposed on the display panel 110, the display drive circuit 130a may transmit the gate control signal to the gate signal generation circuit 211 to output the gate signal. The gate signal generation circuit 211 may be referred to as the gate-in panel (GIP). The gate control signal may be a clock, a start pulse, or a synchronization signal. However, the present disclosure is not limited thereto.

The touch sensor part 120 may sense a touch point of the display panel 110. The touch sensor part 120 may include a plurality of touch electrodes disposed on the display panel 110. Here, the touch sensor part 120 is shown as one component on the display panel 110, but it is only conceptual and not limited thereto.

The touch drive circuit 130b may transmit/receive the touch signal to/from the touch sensor part 120 in response to the touch control signal. The touch signal may include a touch driving signal and a touch sensing signal.

The display drive circuit 130a and the touch drive circuit 130b may be connected to the display panel 110 in the form of a chip on film (COF). That is, the display drive circuit 130a and the touch drive circuit 130b are disposed on the respective films 131, and the film 131 can be connected to the substrate 111. The film 131 may be connected to a source printed circuit board (SPCB) 132 and the display drive circuit 130a and the touch drive circuit 130b may receive a signal through the SPCB 132. Here, although an aspect in which the number of the display drive circuit 130a and the number of the touch drive circuits 130b are two is shown as an example, the present disclosure is not limited thereto. Although the display drive circuit 130a and the touch drive circuit 130b are shown as alternately arranged, the present disclosure is not limited thereto. The number of the display drive circuit 130a and the number of the touch drive circuits 130b are shown to be the same, but the present disclosure is not limited thereto. The number of the display drive circuit 130a and the number of the touch drive circuits 130b may be determined depending on the size and/or resolution of the display panel 110 and the size of the touch sensor part 120.

The display device 100 may further include a control circuit 140. The control circuit 140 may control the display drive circuit 130a and the touch drive circuit 130b. The control circuit 140 may include a timing controller (T-CON) 140a and a micro-control circuit (MCU) 140b. The T-CON 140a and the MCU 140b may control the display drive circuit 130a and the touch drive circuit 130b respectively. The control circuit 140 may be disposed on a control printed circuit board (CPCB) 141 and the CPCB 141 may be connected to the SPCB 132 through the flexible flat circuit (FFC) 142.

Figure 3:
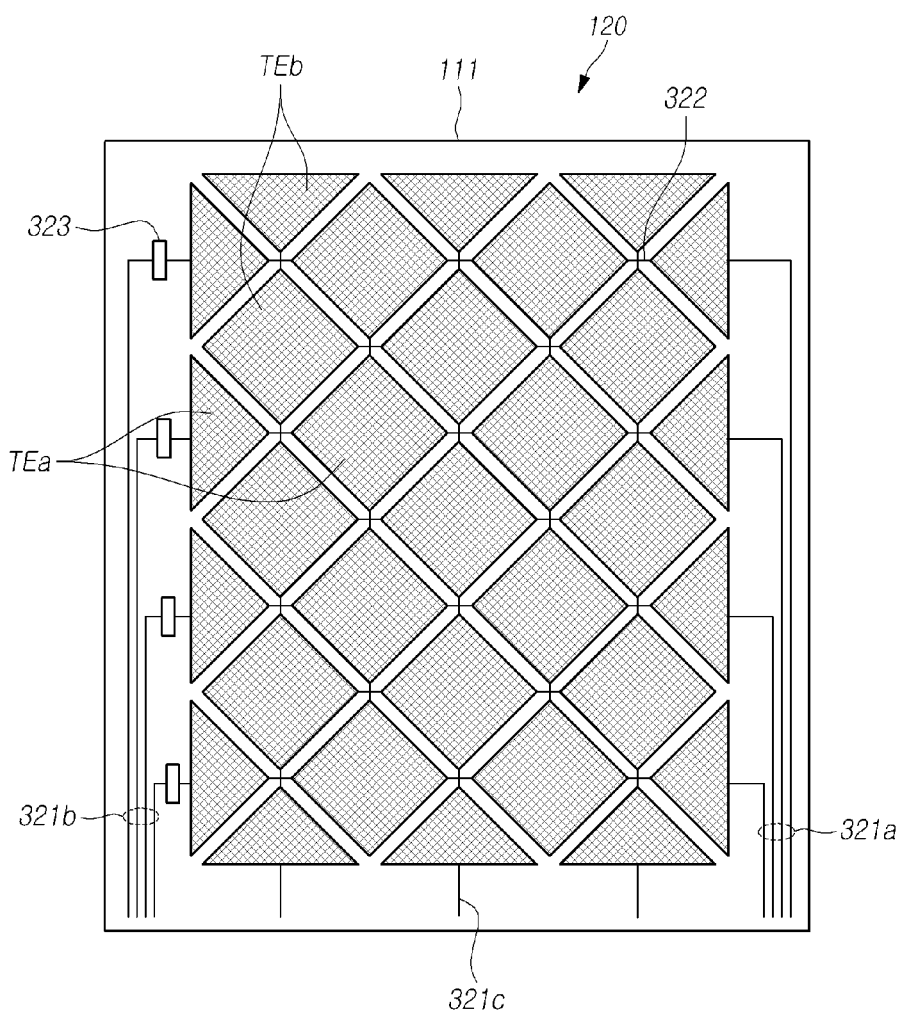
FIG. 3 is a plan view illustrating a first aspect of the touch sensor part shown in FIG. 1.

FIG. 3 is a plan view illustrating a first aspect of the touch sensor part shown in FIG. 1.

Referring to FIG. 3, the touch sensor part 120 may be disposed on the substrate 111 and may include a plurality of first electrodes TEa and a plurality of second electrodes TEb. The plurality of first electrodes TEa may correspond to the touch driving electrodes and the plurality of second electrodes TEb may correspond to the touch sensing electrodes. The plurality of first electrodes TEa are connected in the row direction by the connection portion 322 to form a plurality of touch electrode lines in the row direction, and the plurality of second electrodes TEb may be connected in the column direction by the connection portion 322 to form a plurality of touch electrode lines. Here, the number of the first electrodes TEa and the number of the second electrodes TEb may correspond to the size of the substrate 111, and is not limited to the illustrated example.

The first electrodes TEa may receive the touch driving signal and the second electrodes TEb may transmit the touch sensing signal corresponding to the touch driving signal. The first electrodes TEa and the second electrodes TEb may be formed on the same layer on the display panel 110, however, the present disclosure is not limited thereto.

The first electrodes TEa may be connected to the touch lines 321a and 321b, and the second electrodes TEb may be connected to the touch line 321c. The touch lines 321a and 321b connected to the first electrodes TEa may transmit the touch driving signal from the touch drive circuit 130b shown in FIG. 1 to the first electrodes Tea. The touch line 321c connected to the second electrodes TEb may transmit the touch sensing signal to the touch drive circuit 130b shown in FIG. 1. Also, the touch line 321b connected to the first electrodes TEa may be connected to the touch signal generation circuit.

The connection portion 322 may connect one first electrode TEa to the other first electrodes. In addition, the connection portion 322 may connect one second electrode TEb to the other second electrodes. The connection portion 322 intersects with each other. Therefore, in order to prevent the first electrodes TEa and the second electrodes TEb from being directly connected to each other, the connection portion 322 connecting the first electrodes TEa may be formed on a layer different from the first electrode TEa and the second electrode TEb, and the first electrodes TEa and the connection portion 322 may be connected through the via. The connection portion 322 connecting the second electrodes TEb may be formed on the same layer as the first electrode TEa and the second electrode TEb to connect the second electrodes TEb in the same layer. For this purpose, an insulating layer (not shown) may be disposed between the connection portion 322 connecting the first electrodes TEa and the connection portion 322 connecting the second electrodes TEb.

The first electrode TEa and the second electrode TEb may be formed by patterning a conductive metal layer. The first electrode TEa and the second electrode TEb may be formed of a transparent material such as indium tin oxide (ITO). The patterned first electrode TEa and the second electrode TEb may include an electrode pattern formed in the form of a mesh, and the first electrode TEa and the second electrode TEb may include a plurality of openings. The emitted from the display device may be transmitted through the first electrode TEa and the second electrode TEb or may be emitted to the outside through the first electrode TEa and the second electrode TEb made of the ITO electrode or the plurality of openings included in the first electrode TEa and the second electrode TEb.

The patterns of the first electrode TEa and the second electrode TEb formed in a mesh shape can be referred to as the touch electrode line. The first electrode TEa and the second electrode TEb may be connected to the driving line 321a for applying the driving signal and the sensing line 321b to which the sensing signal generated corresponding to a touch sensed by the touch electrode is transmitted.

Figure 4:
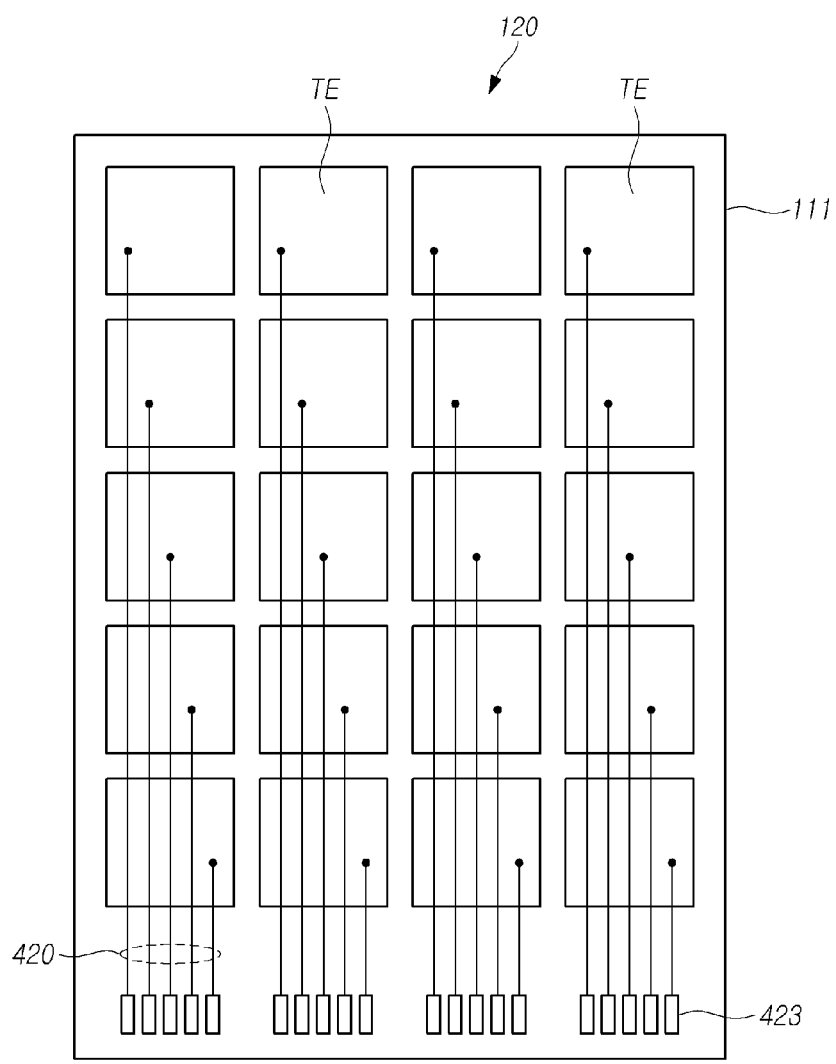
FIG. 4 is a plan view illustrating a second aspect of the touch sensor part shown in FIG. 1.

FIG. 4 is a plan view illustrating the second aspect of the touch sensor part shown in FIG. 1.

Referring to FIG. 4, the touch sensor part 120 may be disposed on the substrate 111 and the plurality of touch electrodes TE having a predetermined area may be arranged on the substrate 111 in a matrix form. In addition, each touch electrode TE may be connected to a plurality of touch lines 420 that receive the touch sensing signal from the touch electrode TE. The touch line 420 may be disposed under the touch electrode TE and can touch a part of the area of the touch electrode TE. The touch electrode TE and the touch lines 420 may be mounted in the display panel 110 so that the display device does not include a separate touch panel on the display panel 110, thus, the thin display device may be implemented. The touch lines 420 may be connected to the touch signal generation circuit.

Figure 5:
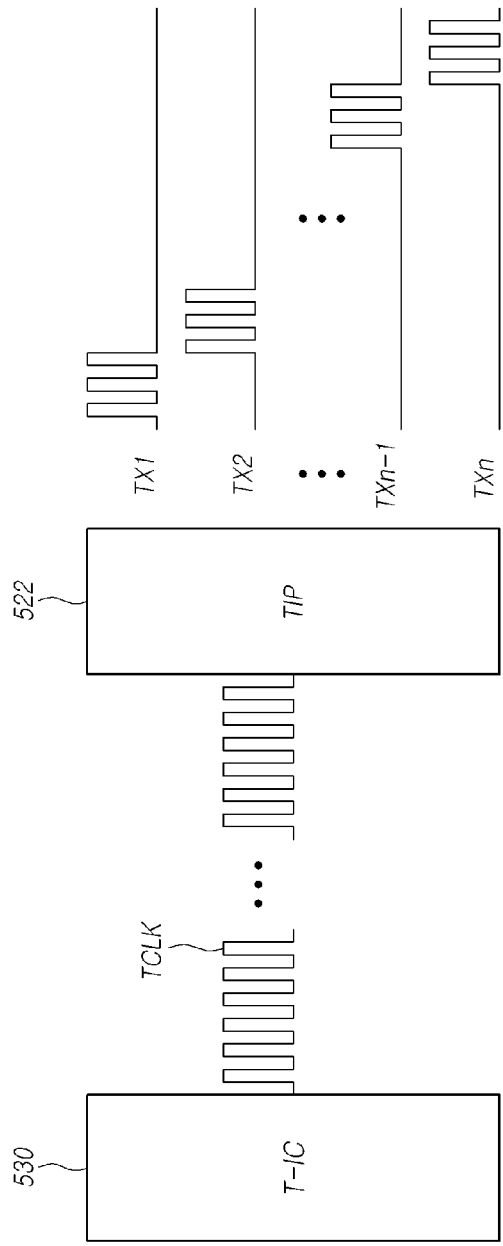
FIG. 5 is a conceptual diagram illustrating the first aspect of the operation of the touch driver circuit and the touch signal generator shown in FIG. 1.

FIG. 5 is a conceptual diagram illustrating the first aspect of the operation of the touch driver circuit and the touch signal generator shown in FIG. 1.

Referring to FIG. 5, the touch drive circuit 530 may output one touch clock TCLK and the touch signal generation circuit 522 may generates a plurality of touch driving signals TX1, TX2, . . . , TXn−1, TXn using one touch clock TCLK received from the touch drive circuit 530. The plurality of touch driving signals output from the touch signal generation circuit 522 may be supplied to the plurality of touch lines 321b shown in FIG. 3 or the touch lines 420 shown in FIG. 4, respectively. The sequential output of the plurality of touch driving signals TX1, TX2, . . . , TXn−1, TXn using one touch clock TCLK may be referred to as single-touch driving. Here, the touch signal generation circuit 522 is shown as one block, but the present disclosure is not limited thereto, and one touch signal generation circuit 522 may be connected to one touch driving line.

Figure 6:
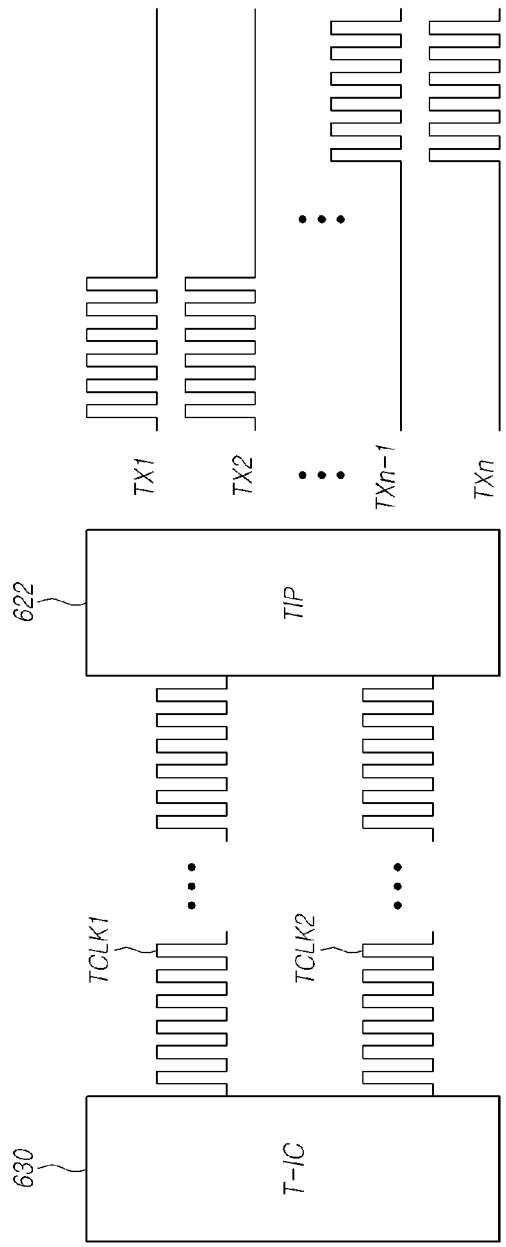
FIG. 6 is a conceptual diagram illustrating the second aspect of the operation of the touch driver circuit and the touch signal generator shown in FIG. 1.

FIG. 6 is a conceptual diagram illustrating the second aspect of the operation of the touch driver circuit and the touch signal generator shown in FIG. 1.

Referring to FIG. 6, the touch drive circuit 630 may output two touch clocks TCLK1 and TCLK2 and the touch signal generation circuit 622 may generate and output a plurality of touch driving signals TX1, TX2, . . . , TXn−1, TXn using the two touch clocks TCLK1 and TCLK2 received from the touch drive circuit 630. For the plurality of touch driving lines, which receive the plurality of touch driving signals TX1, TX2, . . . , TXn−1, TXn, two lines are set to be one set, and each set may sequentially receive the touch driving signal. Here, the two touch driving lines corresponding to one set may be touch driving lines adjacent to each other. For example, if sixteen touch driving lines are arranged, the first and second touch driving lines may be one set and the third and fourth touch driving lines may be another set. The touch signal generation circuit 622 may receive the two touch clocks TCLK1 and TCLK2 and simultaneously outputs two touch driving signals TX1 and TX2 to the first and second touch driving lines. The touch signal generation circuit 622 may receive the two touch clocks TCLK1 and TCLK2 and simultaneously outputs two touch driving signals TX3 and TX4 to the third and fourth touch driving lines. In this manner, the touch driving signal can be transmitted to all the touch driving lines.

Here, the number of touch clocks TCLK1 and TCLK2 output to the touch drive circuit 630 is shown to be two, but is not limited thereto. For example, the number of touch clocks TCLK1 and TCLK2 output to the touch signal generation circuit 622 may be four, six, eight, and so on. In addition, the number of touch driving lines set to one set may correspond to the number of touch clocks TCLK1 and TCLK2. That is, if the number of touch clocks output to the touch signal generation circuit 622 is four, the number of touch driving lines set to one set may be four. The plurality of touch driving lines simultaneously receiving two or more touch driving signals can be referred to as multi-touch driving.

Figure 7:
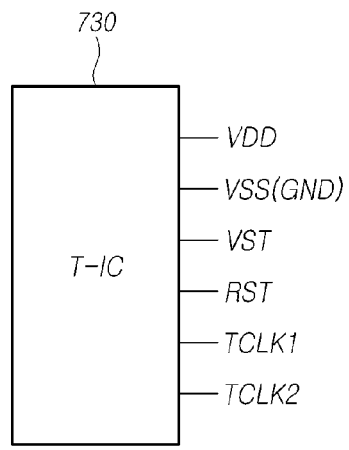
FIG. 7 is a structural diagram illustrating an aspect of the touch drive circuit in FIG. 1.

FIG. 7 is a structural diagram illustrating an aspect of the touch drive circuit in FIG. 1.

Referring to FIG. 7, the touch drive circuit 730 may output the first power VDD, the second power VSS, the first control signal VST, the second control signal RST and the two touch clocks TCLK1 and TCLK2. The voltage level of the first power VDD may be higher than the voltage level of the second power VSS. The second power VSS may be grounded.

In the case that the touch drive circuit 730 is driven by a single touch for sensing one touch point during one touch sensing period, the control circuit 140 may output one touch clock TCLK1. In the case that the touch drive circuit 730 is driven by a multi-touch for sensing a plurality of touch points in one touch sensing period, two touch clocks TCLK1 and TCLK2 may be output. In order to simultaneously apply the touch signal to the four touch driving lines in the multi-touch, the touch drive circuit 730 should be able to output four touch clocks. That is, the touch drive circuit 730 may be able to determine and output the number of touch clocks corresponding to the number of touch driving lines receiving the touch signal at the same time. The number of output pins of the touch clock may be determined in accordance with the number of touch clocks simultaneously output by the touch drive circuit 730.

The touch drive circuit 730 may output only the touch clock without outputting the touch driving signal. As a result, an output terminal for outputting the touch driving signal may be unrequired. Assuming that the control circuit 140 outputs the touch driving signal and the sixteen touch lines for supplying the touch driving signal to the touch sensor part 120 are disposed, the touch drive circuit 730 may be required to include sixteen pins which are connected to 16 touch lines and output the touch driving signal. However, if the touch drive circuit 730 does not output the touch driving signal, in the case of the single touch driving, only one output terminal for outputting one touch clock is required. Similarly, in the case of multi-touch driving in which two touch clock signals are output in parallel, the number of output terminals for outputting the touch clock signal may be two, and in the case of multi-touch driving in which four touch clock signals are output in parallel, the number of output terminals for outputting the touch clock signal may be four. Accordingly, if the touch drive circuit 730 does not output the touch driving signal, the number of output pins of the touch drive circuit 730 may be reduced, thereby implementing the small size of the touch drive circuit 730. In addition, since the touch drive circuit 730 having a small size may be utilized, the manufacturing cost of the display device 100 can be reduced.

Figure 8:
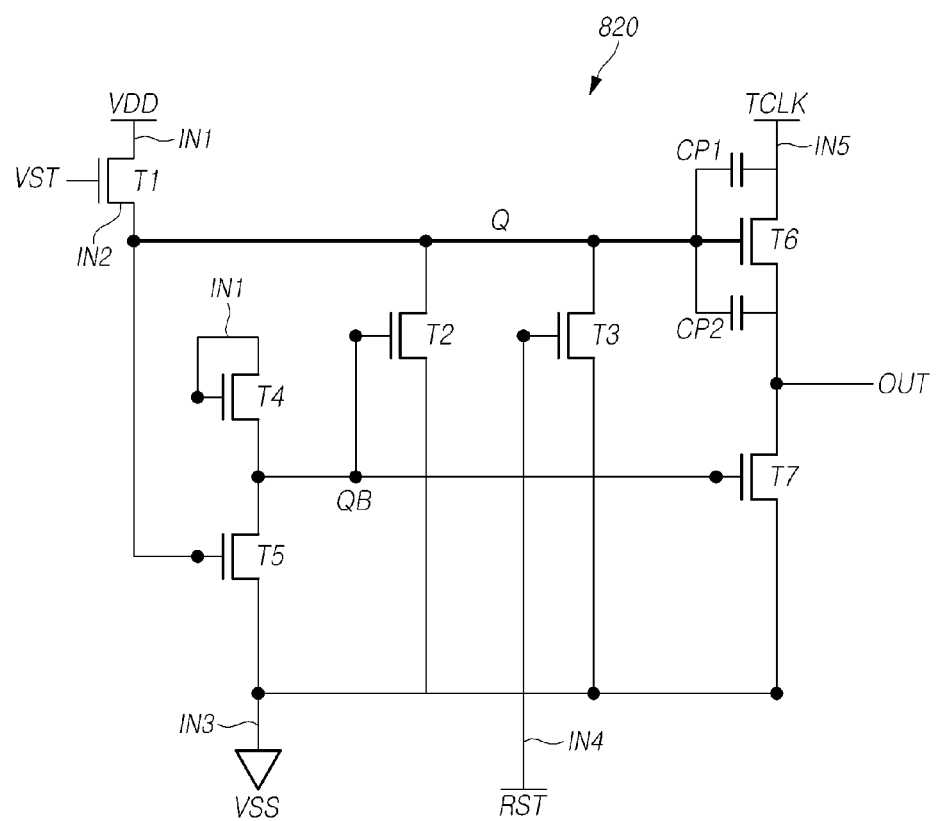
FIG. 8 is a circuit diagram illustrating an aspect of the touch signal generator shown in FIG. 2.

FIG. 8 is a circuit diagram illustrating an aspect of the touch signal generator shown in FIG. 2.

Referring to FIG. 8, the touch signal generation circuit 820 may include the first transistor T1 having the first electrode connected to the first input terminal IN1 to which the first power VDD is supplied, the second electrode connected to the first node (Q), and the gate electrode connected to the second input terminal IN2 to which the first control signal VST is transmitted, and the second transistor T2 having the first electrode connected to the first node (Q), the second electrode connected to a third input terminal IN3 to which the second power is supplied, and the gate electrode connected to the second node (QB). The touch signal generation circuit 820 may include the third transistor T3 having the first electrode connected to the first node (Q), the second electrode connected to the third input terminal IN3 to which the second power VSS is inputted, and the gate electrode connected to the fourth input terminal IN4 to which a second control signal RST is transmitted; the fourth transistor T4 having the first electrode connected to the first input terminal IN1 to which the first power VDD is transmitted, the second electrode connected to the second node (QB), and a gate electrode connected to the first input terminal IN1; the fifth transistor T5 having the first electrode connected to the second node (QB), the second electrode connected to the third input terminal IN3, and a gate electrode coupled to the first node (Q); the sixth transistor T6 having the first electrode connected to a fifth input terminal IN5 to which the touch clock signal TCLK is input, the second electrode connected to a output terminal OUT, and a gate electrode connected to the first node (Q); and the seventh transistor T7 having the first electrode connected to the output terminal OUT, the second electrode connected to the third input terminal IN3, and the gate electrode connected to the second node (QB). The voltage level of the first power VDD may be higher than the voltage level of the second power VSS. Also, the second power VSS may correspond to the ground GND.

The voltage level of the touch driving signal output from the touch signal generation circuit 820 may be higher than the voltage level of the touch clock signal TCLK input from the fifth input terminal IN5. The voltage level of the touch driving signal may be output higher than the voltage level of the touch clock signal TCLK in correspondent to the parasitic capacitor CP1 formed between the fifth input terminal IN5 and the first node (Q) and the parasitic capacitor CP2 formed between the output terminal OUT and the first node (Q).

FIG. 9 is a timing chart illustrating a first aspect of the operation of the touch signal generator shown in FIG. 8.

In FIG. 9, (a) is a timing chart illustrating an example of signals input to the touch signal generation circuit 820; (b) is a timing chart showing voltages applied to the first node (Q) and the second node (QB) of the touch signal generation circuit 820; and (c) is a timing chart illustrating the voltage of the output terminal OUT of the touch signal generation circuit 820. As shown in (a), the touch signal generation circuit 820 may not receive the first control signal VST, the second control signal RST and the touch clock signal TCLK in the first interval A. The touch signal generation circuit 820 may receive the first control signal VST and does not receive the second control signal RST and the touch clock signal TCLK in the second interval B. The touch signal generation circuit 820 may receive the touch clock signal TCLK in the third interval C without receiving the first control signal VST and the second control signal RST. The touch signal generation circuit 820 may receive the second control signal RST without receiving the first control signal VST and the touch clock signal TCLK in the fourth interval D.

If the touch signal generation circuit 820 does not receive the first control signal VST and the second control signal RST in the first interval A, the first transistor T1 and the fourth transistor T4 may be in OFF state. If the first transistor T1 is turned off, the first power VDD is not transmitted to the first node (Q). At this time, the fourth transistor T4 may maintain the ON state and the voltage of the first power VDD may be applied to the second node (QB). Therefore, as shown in (b), the second node (QB) may be in a high state in the first interval A. if the second node (QB) is in the high state, the second transistor T2 may be in the ON state. If the second transistor T2 is the ON state, the voltage of the second power VSS may be transmitted to the first node (Q). As a result, the first node (Q) may be in a low state as shown in (b). When the first node (Q) is in the low state, the sixth transistor T6 may be in the OFF state. Then, as shown in (c), the output terminal OUT may become a low state.

In addition, as shown in (a), the first control signal VST in the high state is transferred to the touch signal generation circuit 820 and the second control signal RST is not transmitted in the second interval B. In addition, the touch clock signal TCLK is also not transmitted. If the first control signal VST in the high state is transferred, the first transistor T1 is turned on and the voltage of the first power VDD is transferred to the first node (Q). Therefore, as shown in (b), the voltage of the first node (Q) may rise to reach the voltage level of the first power VDD. When the voltage level of the first node (Q) becomes the voltage of the first power VDD, the fifth transistor T5 may be turned on. When the fifth transistor T5 is turned on, the second power is supplied to the second node (QB) and the second node (QB) has the voltage level of the second power as shown in (b). When the second node (QB) has the voltage level of the second power, the second transistor T2 may be in the OFF state. Also, the seventh transistor T7 may be also in the OFF state. Although the sixth transistor T6 may be turned on by the voltage of the first node (Q), since the touch clock signal TCLK is not transmitted and the signal may be not outputted to the output terminal OUT as shown in (c). In addition, in the second interval B, the first power VDD may not be outputted from the touch IC 730.

In addition, as shown in (a), in the third interval C, the first control signal VST and the second control signal RST may not transmitted, and the touch clock signal TCLK may be transmitted. If the first control signal VST is not transferred, the first transistor T1 may be in the OFF state. If the second control signal RST is not transmitted, the third transistor T3 may be in the OFF state. The voltage of the first node (Q) may maintain the high voltage level of the second period B even if the first transistor T1 is turned off because the third transistor T3 is in the OFF state. Therefore, the fifth transistor T5 may be maintained in the ON state so that the voltage of the second node (QB) may have the voltage level of the second power. As a result, the seventh transistor T7 may maintain the OFF state. At this time, when the touch clock signal TCLK is inputted through the fifth input terminal IN5, the voltage of the first node (Q) may be increased by the parasitic capacitor CP1. As a result, the voltage level of the first node (Q) can be higher than the voltage level of the first power VDD. When the voltage level of the first node (Q) becomes high, the voltage level of the output terminal OUT may also become high. Therefore, the voltage level of the touch driving signal output from the output terminal OUT may be higher than that of the touch clock signal TCLK. In addition, the touch clock signal TCLK may be a plurality of square waves having a constant frequency. For example, if the frequency of the touch clock signal TCLK is 200 kHz and the voltage level is between 0 and 6 V, the voltage level of the touch driving signal may be higher than 6V by the first parasitic capacitor CP1 and the second parasitic capacitor CP2.

In addition, as shown in (a), in the fourth interval D, the first control signal VST and the touch clock signal TCLK are not transmitted, and the second control signal RST is transmitted in a high state. The first transistor T1 may maintain the OFF state since the first control signal VST is not transmitted. However, since the second control signal RST is transferred, the third transistor T3 is turned on and the first node (Q) may be discharged through the third transistor T3. If the voltage of the first node (Q) is discharged, the fifth transistor T5 and the sixth transistor T6 may be turned off. When the fifth transistor T5 is turned off, the first power VDD may be in the high state through the fourth transistor T4, and thus the seventh transistor T7 may be in the ON state. Therefore, the output terminal OUT may have the voltage level of the second power VSS. Although the maximum value of the voltage levels of the first control signal VST, the second control signal RST and the touch clock TCLK is illustrated to be the voltage level of the first power VDD, the present disclosure is not limited thereto.

Figure 10:
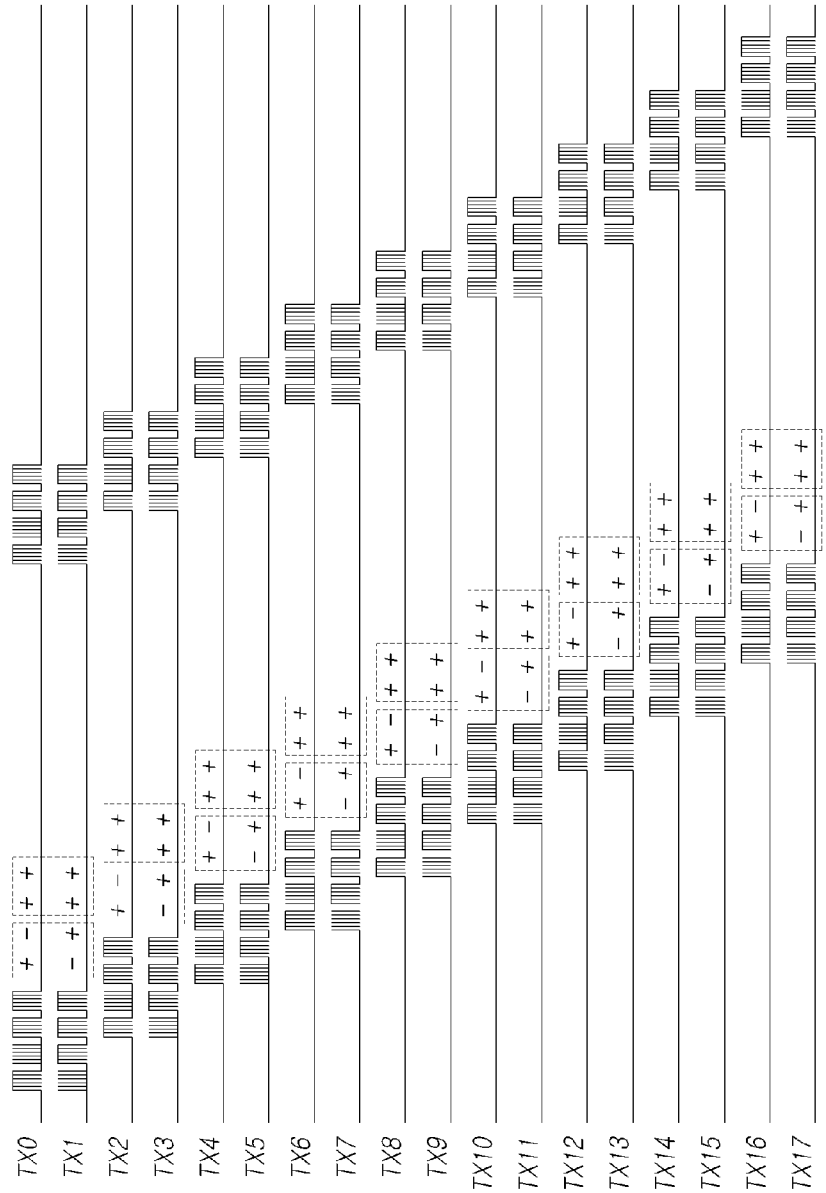
FIG. 10 is a timing chart illustrating an aspect of a touch signal output from the touch signal generator shown in FIG. 6.

FIG. 10 is a timing chart illustrating an aspect of a touch signal output from the touch signal generator shown in FIG. 6.

Referring to FIG. 10, the touch signal generation circuit 622 may perform multi-driving in which the touch signal is simultaneously supplied to two touch driving lines. The touch signal generation circuit 622 may output a plurality of touch driving signals TX1, . . . , TX18. The number of touch driving signals outputted from the touch signal generation circuit 622 may be illustrated to be eighteen, but the present disclosure is not limited thereto.

The first touch driving signal TX1 and the second touch driving signal TX2 may be simultaneously output. The first touch driving signal TX1 and the second touch driving signal TX2 may be outputted in phases opposite to each other in the first interval TD1 and may be outputted in the same phase in the second interval TD2. The touch signal generation circuit 622 may determine the phases of the plurality of touch driving signals TX1, . . . , TX18 corresponding to the +, − codes. The touch signal generation circuit 622 may simultaneously output the third touch driving signal TX3 and the fourth driving signal TX4. The third touch driving signal TX3 and the fourth driving signal TX4 may partially overlap the first touch driving signal TX1 and the second touch driving signal TX2. For example, the first touch driving signal TX1 and the third touch driving signal TX3 may overlap in the second interval TD2. The third touch driving signal TX3 and the fourth touch driving signal TX4 may be opposite in phase to each other in the second interval TD2 and may have the same phase in the third interval TD3. The plurality of touch driving signals TX1, . . . , TX18 may be output in the same manner as described above. Although two touch driving signals are illustrated to be output simultaneously, the number of touch driving signals simultaneously output by the touch signal generation circuit 622 may be not limited thereto.

Figure 11:
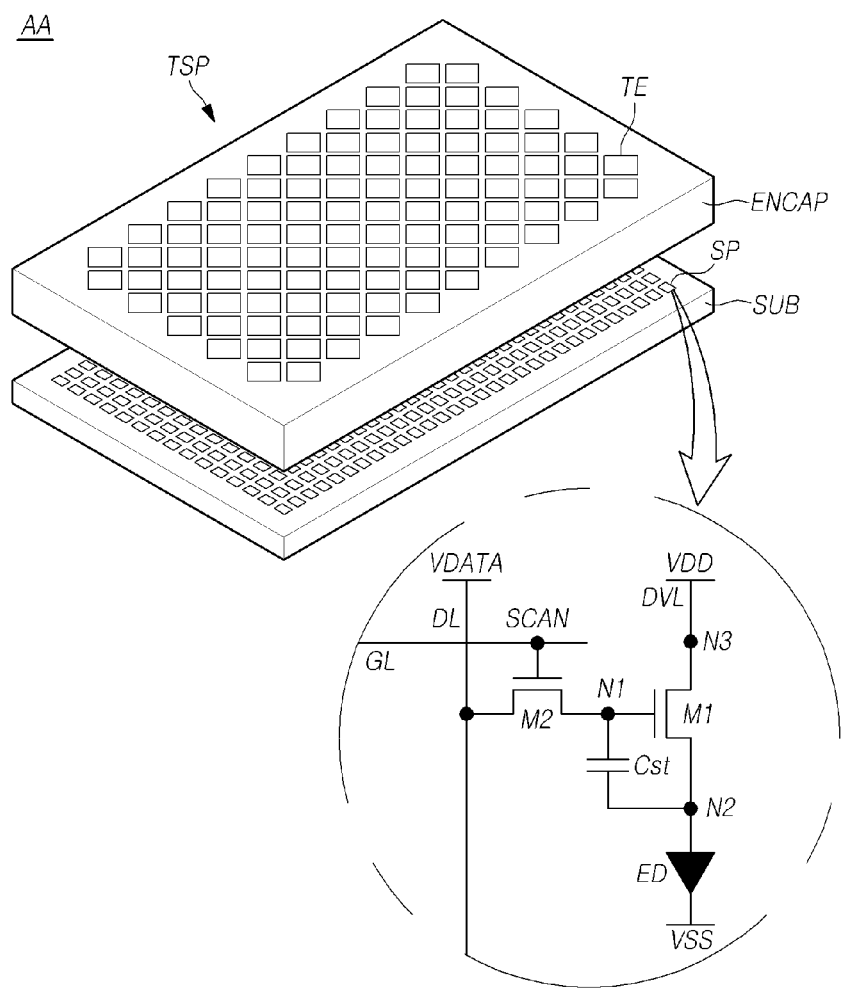
FIG. 11 is a perspective view illustrating an aspect of a structure in which the touch panel (TSP) is embedded in a display panel (DISP) according to the present disclosure.

FIG. 11 is a perspective view illustrating an aspect of a structure in which the touch panel (TSP) is embedded in a display panel (DISP) according to aspects of the present disclosure.

Referring to FIG. 11, in the active area (AA) of the display panel (DISP), the plurality of subpixels (SP) may be arranged on the substrate (SUB). Each subpixel (SP) may include the light emitting element (ED), the first transistor (M1) for driving the light emitting element (ED), the second transistor (M2) for transmitting the data voltage (VDATA) to the first node (N1) of the first transistor (M1), and the storage capacitor (Cst) for maintaining a constant voltage for one frame.

The first transistor (M1) may include the first node (N1) to which the data voltage is applied, a second node (N2) to be electrically connected to the light emitting element (ED), and a third node (N3) to which the driving voltage (ELVDD) from a driving voltage line (DVL) is applied. The first node (N1) may be a gate node, the second node (N2) may be a source node or a drain node, and the third node (N3) may be a drain node or a source node. The first transistor (M1) may be also referred to as a driving transistor for driving the light emitting element (ED).

The light emitting element (ED) may include a first electrode (e.g., an anode electrode), a light emitting layer and a second electrode (e.g., a cathode electrode). The first electrode may be electrically connected to the second node (N2) of the first transistor (M1) and a base voltage (ELVSS) may be applied to the second electrode. The light emitting layer in the light emitting element (ED) may include a plurality of layers. The light emitting layer may be an organic light emitting layer containing an organic material. In this case, the light emitting element (ED) may be an organic light emitting diode (OLED).

The second transistor (M2) may be controlled to be turned on and off by a scan signal (SCAN) applied through the gate line (GL) and may be electrically connected between the first node (N1) of the first transistor (M1) and the data line (DL). The second transistor (M2) may be also referred to as a switching transistor. The second transistor (M2) is turned on by the scan signal (SCAN) and transfers the data voltage (VDATA) supplied from the data line (DL) to the first node (N1) of the first transistor (M1).

The storage capacitor (Cst) may be electrically connected between the first node (N1) and the second node (N2) of the first transistor (M1).

Each subpixel (SP) may have a 2T1C structure including two transistors (M1, M2) and one capacitor (Cst) as shown in FIG. 11, and in some cases, may further include one or more transistors or one or more capacitors.

The storage capacitor (Cst) may not be a parasitic capacitor (e.g., Cgs, Cgd) which is an internal capacitor existing between the first node (N1) and the second node (N2) of the first transistor (M1) but may be an external capacitor intentionally designed outside the first transistor (M1).

Each of the first transistor (M1) and the second transistor (M2) may be an n-type transistor or a p-type transistor.

As described above, the circuit elements such as the light emitting element (ED), two or more transistors (M1, M2) and one or more capacitors (Cst) may be arranged in the display panel (DISP). Such a circuit element (in particular, the light emitting element ED) may be vulnerable to external moisture or oxygen, and therefore, the encapsulation (ENCAP) or the encapsulation layer for preventing external moisture or oxygen from introducing into the circuit element (in particular, the light emitting element ED) may be disposed on the display panel (DISP).

The encapsulation (ENCAP) may be a single layer or may be a plurality of layers.

For example, in the case that the encapsulation (ENCAP) comprises a plurality of layers, the encapsulation (ENCAP) may include one or more inorganic encapsulation layers and one or more organic encapsulation layers. As a specific example, the encapsulation (ENCAP) may comprise a first inorganic encapsulation layer, an organic encapsulation layer and a second inorganic encapsulation layer. Here, the organic encapsulation layer may be located between the first inorganic encapsulation layer and the second inorganic encapsulation layer.

The first inorganic encapsulation layer may be formed on the second electrode (e.g., the cathode electrode) so as to be closest to the light emitting element (ED). The first inorganic encapsulation layer may be formed of an inorganic insulating material capable of low temperature deposition such as silicon nitride (SiNx), silicon oxide (SiOx), silicon oxynitride (SiON), or aluminum oxide (Al2O3). Accordingly, since the first inorganic encapsulation layer is deposited in a low-temperature atmosphere, damage to the light emitting layer (organic light emitting layer) vulnerable to a high-temperature can be prevented during the deposition of the first inorganic encapsulation layer.

The organic encapsulation layer may have a smaller area than the first inorganic encapsulation layer and may be formed to expose both ends of the first inorganic encapsulation layer. The organic encapsulation layer may function as a buffer for relieving the stress between the respective layers due to the bending of the touch display device, and can enhance the planarization performance. The organic encapsulation layer may be formed of, for example, an organic insulating material such as acrylic resin, epoxy resin, polyimide, polyethylene or silicon oxycarbide (SiOC).

The second inorganic encapsulation layer may be formed on the organic encapsulation layer so as to cover the upper surface and the side surfaces of the organic encapsulation layer and the first inorganic encapsulation layer, respectively. Accordingly, the second inorganic encapsulation layer can minimize or prevent external moisture or oxygen from penetrating into the first inorganic encapsulation layer and the organic encapsulation layer. The second inorganic encapsulation layer may be formed of, for example, an inorganic insulating material such as silicon nitride (SiNx), silicon oxide (SiOx), silicon oxynitride (SiON), or aluminum oxide (Al2O3).

In the touch display device according to the aspects of the present disclosure, the touch panel (TSP) may be formed on the encapsulation (ENCAP).

That is, in the touch display device, the touch sensor structure such as the plurality of touch electrodes (TE) forming the touch panel (TSP) may be disposed on the encapsulation (ENCAP).

In the touch sensing, the touch driving signal or the touch sensing signal may be applied to the touch electrode (TE). Therefore, in the touch sensing, a potential difference may be formed between the touch electrode (TE) and the cathode electrode disposed with the encapsulation (ENCAP) therebetween, and unnecessary parasitic capacitance may be generated. Since this parasitic capacitance may lower the touch sensitivity, the distance between the touch electrode (TE) and the cathode electrode may be set to a predetermined value (for example, 5 μm) or more. For this, for example, the thickness of the encapsulation layer (ENCAP) may be designed to be at least 5 μm or more.

Figure 12:
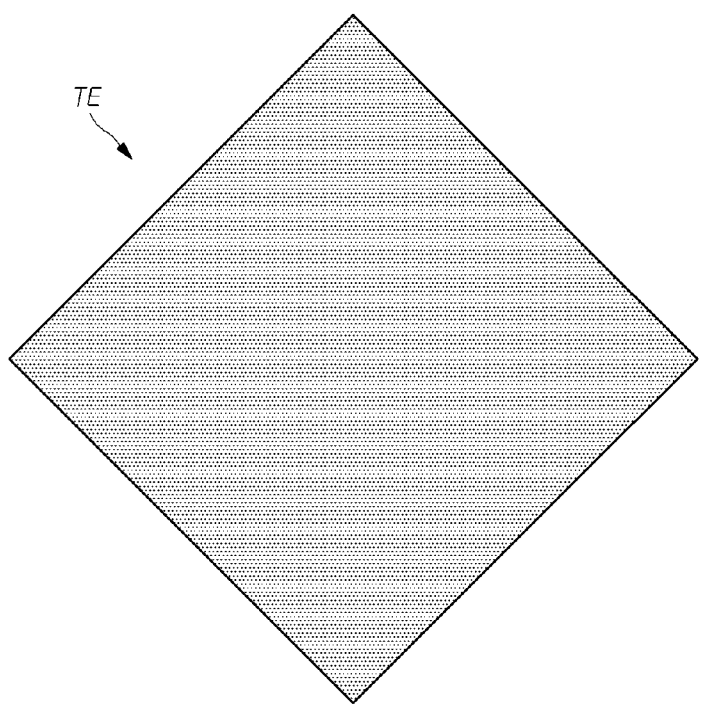
FIG. 12 is a plan view illustrating a first aspect of types of touch electrodes (TE) disposed on the display panel (DISP) according to the present disclosure.
Figure 13:
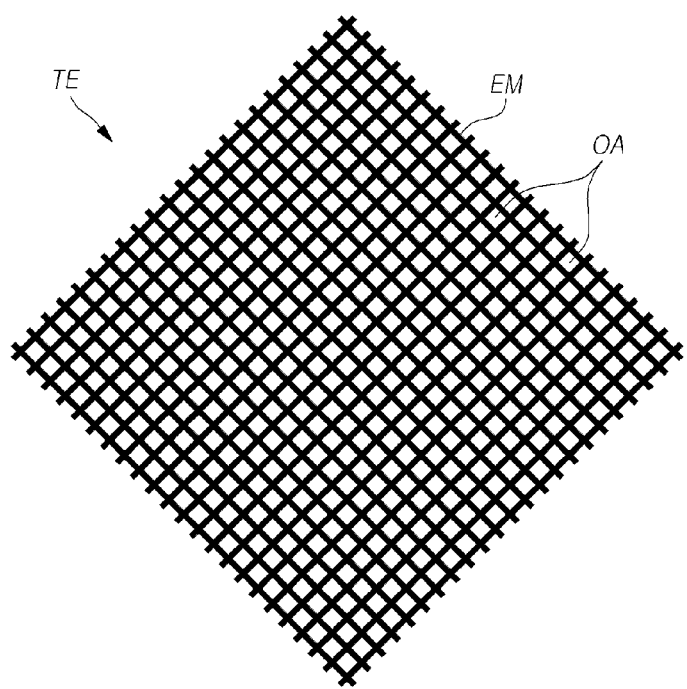
FIG. 13 is a plan view illustrating a second aspect of types of touch electrodes (TE) disposed on the display panel (DISP) according to the present disclosure.
Figure 14:
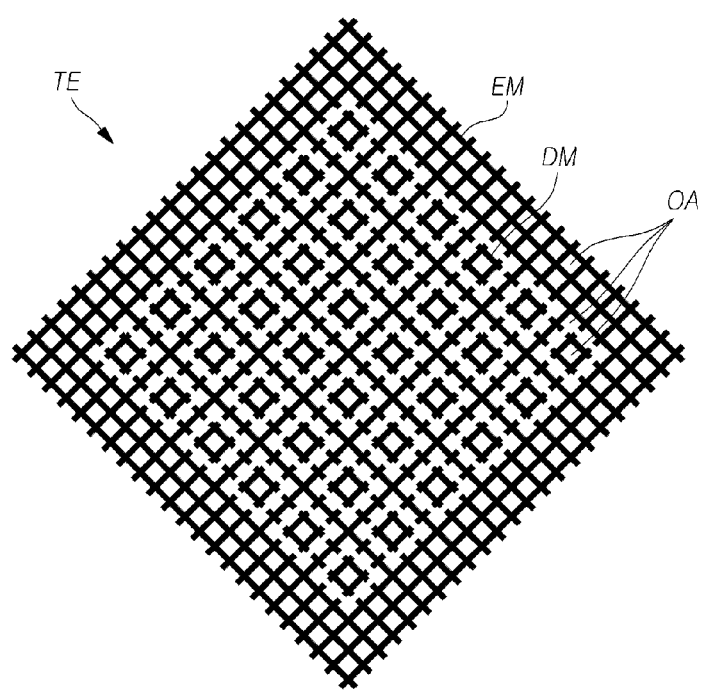
FIG. 14 is a plan view illustrating a third aspect of types of touch electrodes (TE) disposed on the display panel (DISP) according to the present disclosure.

FIG. 12 is a plan view illustrating the first aspect of types of touch electrodes (TE) disposed on the display panel (DISP) according to aspects of the present disclosure, and FIG. 13 is a plan view illustrating the second aspect of types of touch electrodes (TE) disposed on the display panel (DISP) according to aspects of the present disclosure, and FIG. 14 is a plan view illustrating the third aspect of types of touch electrodes (TE) disposed on the display panel (DISP) according to aspects of the present disclosure.

As illustrated in FIG. 12, each of the touch electrodes (TE) disposed on the display panel (DISP) may be a plate shaped electrode metal having no openings. In this case, each touch electrode (TE) may be a transparent electrode. That is, each touch electrode (TE) may be formed of the transparent electrode material so that light emitted from the plurality of subpixels (SP) arranged below may be transmitted upward.

Alternatively, as shown in FIG. 13, each of the touch electrodes (TE) disposed on the display panel (DISP) may be patterned into a mesh type to form electrode metal (EM) having two or more openings (OA).

The electrode metal (EM) corresponds to a substantial touch electrode (TE) and is a portion where the touch driving signal is applied or the touch sensing signal is detected.

As illustrated in FIG. 13, in the case that each touch electrode (TE) is the electrode metal (EM) patterned with a mesh type, two or more openings (OA) may exist in a region of the touch electrode (TE).

Each of the at least two openings (OA) in each touch electrode (TE) may correspond to a light emitting region of one or more subpixels (SP). That is, the plurality of openings (OA) may be paths through which the light emitted from the plurality of subpixels (SP) arranged below passes. Hereinafter, for convenience of explanation, it is assumed that each touch electrode (TE) is the mesh-type electrode metal (EM).

The electrode metal (EM) corresponding to each touch electrode (TE) may be located on a bank which is disposed in an area other than the light emitting area of two or more sub pixels (SP).

Meanwhile, as a method of forming the plurality of touch electrodes (TE), after the electrode metal (EM) is formed in a wide mesh shape, the electrode metal (EM) may be cut into a predetermined pattern to electrically separate the electrode metal (EM) to thereby form the plurality of touch electrodes (TE).

The outline shape of the touch electrode (TE) may be a square shape such as a diamond shape, a rhombus shape, or another shapes such as a triangle shape, a pentagon shape or a hexagon shape.

Referring to FIG. 14, in the area of each touch electrode (TE), there may be the mesh type electrode metal (EM) and at least one dummy metal (DM) separate from the mesh type electrode metal (EM).

The electrode metal (EM) is a portion corresponding to a substantial touch electrode (TE) and is the portion in which the touch driving signal is applied or the touch sensing signal is detected. Meanwhile, though the dummy metal (DM) may exist in the area of the touch electrode (TE), however the touch driving signal is not applied to the dummy metal (DM) and the touch sensing signal is not detected at the dummy metal (DM). That is, the dummy metal (DM) may be an electrically floated metal portion.

Accordingly, the electrode metal (EM) can be electrically connected to the touch driving circuit (TDC), but the dummy metal (DM) is not electrically connected to the touch driving circuit (TDC).

At least one dummy metal (DM) may exist in a state of being disconnected from the electrode metal (EM) in each region of each of the touch electrodes (TE).

Alternatively, at least one dummy metal (DM) may exist in the state of being disconnected from the electrode metal (EM) only in a region of each of some touch electrode among all the touch electrodes (TE). That is, the dummy metal (DM) may not exist in the area of some of the touch electrodes (TE).

As shown in FIG. 13, with regard to the role of dummy metal (DM), in the case that there is no dummy metal DM in the area of the touch electrode (TE) and only the electrode metal (EM) is formed as a mesh type, a visibility problem in which the contour of the electrode metal (EM) is visible on the display surface may occur.

In contrast, as shown in FIG. 14, in the case that one or more dummy metals (DM) are present in the area of the touch electrode (TE), the visibility problem of the outline of the electrode metal (EM) on the display surface may be prevented.

Furthermore, the capacitance of each touch electrode (TE) may be adjusted to improve the touch sensitivity by adjusting the presence or number (dummy metal ratio) of the dummy metal (DM) for each touch electrode (TE).

Meanwhile, the cut electrode metal (EM) may be formed of the dummy metal (DM) by cutting some points on the electrode metal (EM) formed in the area of one touch electrode (TE). That is, the electrode metal (EM) and the dummy metal (DM) may be the same material formed in the same layer.

The touch display device according to the aspects of the present disclosure may sense a touch based on the capacitance formed on the touch electrode (TE).

The touch device according to aspects of the present disclosure may utilize the capacitance-based touch sensing method, which can sense a touch by a mutual-capacitance-based touch sensing method or a self-capacitance-based touch sensing method.

In the case of a mutual-capacitance-based touch sensing method, a plurality of touch electrodes (TE) may be classified into the driving touch electrode (transmission touch electrode) for applying the touch driving signal, and the sensing touch electrode (receiving touch electrode) which is used for detecting the touch sensing signal and forms capacitance with the driving touch electrode.

In the case of the mutual-capacitance-based touch sensing method, the touch sensing circuit (TSC) may detects presence/absence of touch and/or touch coordinates based on a change in capacitance (mutual-capacitance) between the driving touch electrode and the sensing touch electrode generated in accordance with the presence or absence of a pointer such as the finger, pen and the like.

In the case of a self-capacitance-based touch sensing method, each touch electrode (TE) may serve as both the driving touch electrode and the sensing touch electrode. That is, the touch sensing circuit (TSC) applies the touch driving signal to one or more touch electrodes (TE) and detects the touch sensing signal through the touch electrode (TE) to which the touch driving signal is applied. And then, the touch sensing circuit (TSC) may detect the presence or absence of a touch and/or the touch coordinates by using the change in capacitance between the touch electrode (TE) and the pointer such as the finger and the pen and based on the sensed touch sensing signal. In the self-capacitance-based touch sensing method, there is no distinction between the driving touch electrode and the sensing touch electrode.

As described above, the touch display device according to the aspects of the present disclosure can sense the touch by the mutual-capacitance-based touch sensing method or the self-capacitance based touch sensing method. Hereinafter, for convenience of explanation, there is described as an example, the touch display device performing the mutual-capacitance-based touch sensing and having the touch sensor structure for this purpose.

Figure 15:
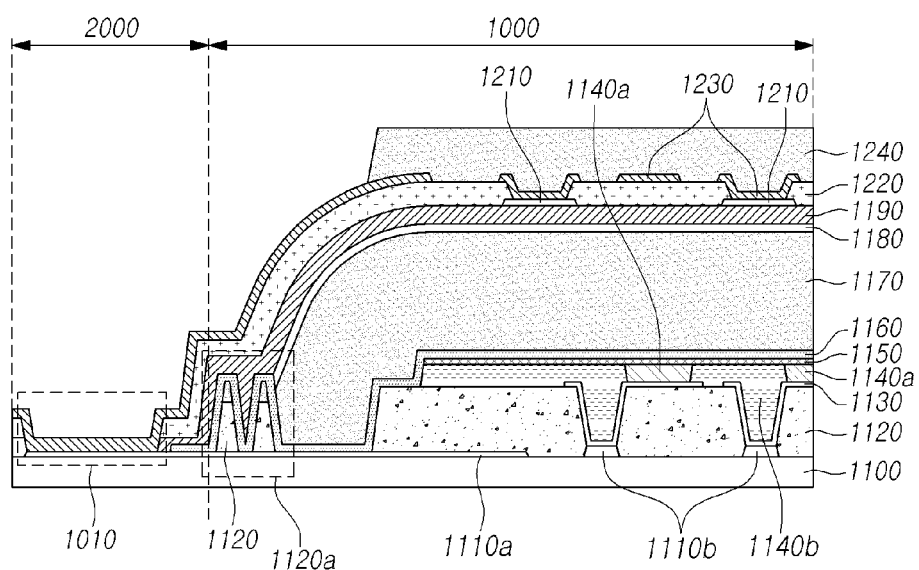
FIG. 15 is a cross-sectional view illustrating a cross-section of the display device according to the present disclosure.

FIG. 15 is a cross-sectional view illustrating an aspect of a cross section of the display device according the present disclosure.

Referring to FIG. 15, the substrate 1100 may be divided into the active area 1000 and the pad area 2000. The thin film transistor, the gate line (not shown) for applying the gate signal to the thin film transistor, and the data line (not shown) for applying the data signal to the thin film transistor may be formed on the active area 1000. The substrate 1100 may be formed of polyamide, but is not limited thereto. Furthermore, the source electrode (not shown) and a drain electrode 111b of the thin film transistor may be formed at the time when the data line is formed on the substrate 1100. The signal line 1110a extending from the pad area 2000 to the active area 1000 may be formed when forming the data line. The signal line 1110a may be the pad 1010 exposed in the pad area 2000 and connected to an external device. However, the present disclosure is not limited thereto. The external device connected to the pad 1010 may be the data driver or the gate driver. The external device connected to the pad 1010 may be a printed circuit board (PCB) on which the data driver and the gate driver are mounted, but is not limited thereto.

A planarization film 1120 may be formed on the drain electrode 1110b. The planarization film 1120 may be patterned and the anode electrode 1130 disposed on the planarization film 1120 may be connected to the drain electrode 1110b disposed below the planarization film 1120. The bank 1140b may be formed on the anode electrode 1130 and the organic light emitting layer 1140a may be formed on the cavity formed in the bank 1140b. The cathode electrode 1150 may be formed on the bank 1140b on which the organic light emitting layer 1140a is formed. The bank 1140b in which the organic light emitting layer 1140a is formed in the cavity may be referred to as the light emitting layer. The cathode electrode 1150 may be the common electrode. The first inorganic film 1160 may be formed on the cathode electrode 1150. When the first inorganic film 1160 is formed, the dam 1120a may be formed at a portion where the pad area 2000 and the active area 1000 are adjacent to each other. The dam 1120a may be formed when the planarization film 1120 is formed. Further, the dam 1120a may be a double structure. When the first inorganic film 1160 is formed, the first inorganic film 1160 may be patterned using a mask. The first inorganic film 1160 may not cover the pad area 2000 by patterning. The first inorganic film 1160 may cover the upper portion of the dam 1120a. However, the present disclosure is not limited thereto. In addition, an area on the substrate 1100 with respect to the dam 1120a may be divided into the active area 1000 and the pad area 2000. However, the present disclosure is not limited thereto, and the pad area 2000 may be the region in which the signal line 1110a disposed on the substrate 1100 is exposed or the conductor disposed on the signal line 1110a is exposed. The conductor disposed on the signal line 1110a may be the second touch electrode 1230 described below.

The first organic film 1170 may be formed on the first inorganic film 1160. The first organic film 1170 may be disposed to be a thick layer on the organic light emitting film 1140a to protect the organic light emitting film 1140a, so that it is possible to prevent the external matter such as moisture from penetrating into the organic light emitting film 1140a. The first inorganic film 1160 may have a certain limit to increase the thickness. Therefore, the organic light emitting film 1140a can be protected by increasing the thickness by disposing the first organic film 1170 on the first inorganic film 1160. It is possible to prevent the first organic film 1170 from penetrating into the pad area 2000 by the dam 1120a.

The second inorganic film 1180 may be formed on the first organic film 1170. The second inorganic film 1180 may cover the upper portion of the dam 1120a formed by the first inorganic film 1160 and the planarization film 1120. The stacked first inorganic film 1160, the first organic film 1170 and the second inorganic film 1180 can be referred to as the encapsulation or the encapsulation layer.

A touch buffer layer 1190 may be formed on the second inorganic film 1180. The touch sensor part may be mounted on the encapsulation or the encapsulation layer by patterning the touch electrode on the encapsulation or the encapsulation layer. Damage to the encapsulation or the encapsulation layer may occur in the process of forming the touch electrode on the encapsulation or the encapsulation layer. To solve this problem, the touch buffer layer 1190 may be formed on the encapsulation or the encapsulation layer. The touch buffer layer 1190 may be formed of an inorganic film. The function of the touch buffer layer 1190 is not limited to preventing the encapsulation from being damaged in the process of forming the touch electrode.

The first touch electrode 1210 and the second touch electrode 1230 may be formed on the touch buffer layer 1190. The first touch electrode 1210 and the second touch electrode 1230 may be the plurality of touch electrodes shown in FIG. 3. The connection portion 322 may be disposed on a different layer from the plurality of touch electrodes. The touch insulation film 1220 may be disposed under the touch electrode 1230. The contact hole may be formed in the touch insulation film 1220. The second touch electrode 1230 may be connected to the first touch electrode 1210 through the contact hole. The passivation layer 1240 may be formed on the second touch electrode 1230. The passivation layer 1240 may be an organic film or an inorganic film.

The touch buffer layer 1190 and the second inorganic film 1180 may be formed by being patterned when the first touch electrode 1210 is formed. The signal line may be exposed by removing the second inorganic film 1180 and the touch buffer layer 1190 from the pad area 2000 by using the patterning process. The portion where the signal line is exposed may be referred to as the pad 1010. Accordingly, the area of the active area on the substrate 1100 can be widened and the area of the pad area can be reduced, thereby it is possible to implement the small bezel area structure.

After the first touch electrode 1210 is patterned, the touch insulation film 1220 is deposited. And then the second touch electrode 1230 may be patterned and formed on the touch insulation film 1220. At this time, the second touch electrode 1230 may be formed on the signal line 1110a exposed in the pad area 2000. In addition, the signal line 1110a can be in contact with the second touch electrode 1230. Accordingly, the signal can be transmitted to the second touch electrode 1230 through the signal line 1110a.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A display apparatus comprising:
a substrate including an active area where a plurality of pixels is connected to gate lines and data lines intersecting with each other, and a non-active area where a plurality of lines for transmitting signals for driving the plurality of pixels is disposed;
a touch driver circuit supplying a touch clock signal to a touch signal generation circuit without supplying a touch driving signal to the touch signal generation circuit;
wherein the touch signal generation circuit is disposed on the non-active area, receiving the touch clock signal, generates the touch driving signal by using the touch clock signal and outputs the touch driving signal; and
a touch sensor part receiving the touch driving signal and generating touch information on a touch point at the active area, and
wherein the touch sensor part is connected to the touch signal generation circuit through a plurality of touch driving lines,
wherein the touch drive circuit supplies a first touch clock signal to a first touch driving line among the plurality of touch driving lines, and supplies a second touch clock signal to a second touch driving line adjacent to the first touch driving line, and
wherein the first touch clock signal and the second touch clock signal include a first interval having the same phase and a second interval having phases different from each other.

2. The display apparatus of claim 1, wherein the touch driving signal has a voltage level higher than a voltage level of the touch clock signal.

3. The display apparatus of claim 1, wherein the touch signal generation circuit comprises:
a first transistor having a first electrode connected to a first input terminal to which a first power is supplied, a second electrode connected to a first node, and a gate electrode connected to a second input terminal to which a first control signal is transmitted;
a second transistor having a first electrode connected to the first node, a second electrode connected to a third input terminal to which a second power is supplied, and a gate electrode connected to a second node;
a third transistor having a first electrode connected to the first node, a second electrode connected to the third input terminal to which the second power is inputted, and a gate electrode connected to a fourth input terminal to which a second control signal is transmitted;
a fourth transistor having a first electrode connected to the first input terminal to which the first power is transmitted, a second electrode connected to the second node, and a gate electrode connected to the first input terminal;
a fifth transistor having a first electrode connected to the second node, a second electrode connected to the third input terminal, and a gate electrode connected to the first node;
a sixth transistor having a first electrode connected to a fifth input terminal to which the touch clock signal is input, a second electrode connected to a output terminal, and a gate electrode connected to the first node; and
a seventh transistor having a first electrode connected to the output terminal, a second electrode connected to the third input terminal, and a gate electrode connected to the second node.

4. The display apparatus of claim 1, wherein the non-active area is provided with a gate signal generation circuit for supplying a gate signal transmitted to the gate lines.

5. The display apparatus of claim 1, wherein the substrate includes a light emitting layer and an encapsulation for encapsulating the light emitting layer, and the touch sensor part is disposed on the encapsulation.

6. A display device comprising:
a display panel including an active area where a gate line and a data line are disposed and a plurality of pixels arranged in a region where the gate line and the data line intersect with each other and a non-active area;
a touch driver circuit supplying a touch clock signal to a touch signal generation circuit without supplying a touch driving signal to the touch signal generation circuit;
wherein the touch signal generation circuit is disposed on the non-active area, receiving the touch clock signal, generates the touch driving signal by using the touch clock signal, and outputs the touch driving signal;

a display drive circuit supplying a driving signal corresponding to a gate signal applied to the gate line and a data signal applied to the data line; and a touch sensor part including a plurality of touch electrodes receiving the touch driving signal from the touch signal generation circuit and generating information on touch points on the display panel, and wherein the touch sensor part is connected to the touch signal generation circuit through a plurality of touch driving lines, wherein the touch drive circuit supplies a first touch clock signal to a first touch driving line among the plurality of touch driving lines, and supplies a second touch clock signal to a second touch driving line adjacent to the first touch driving line, and wherein the first touch clock signal and the second touch clock signal include a first interval having the same phase and a second interval having phases different from each other.

7. The display apparatus of claim 6, further comprising a gate signal generation circuit receiving the driving signal from the display drive circuit and generating the gate signal.

8. The display apparatus of claim 6, wherein the touch signal generation circuit comprises:
a first transistor having a first electrode connected to a first input terminal to which a first power is supplied, a second electrode connected to a first node, and a gate electrode connected to a second input terminal to which a first control signal is transmitted;
a second transistor having a first electrode connected to the first node, a second electrode connected to a third input terminal to which a second power is supplied, and a gate electrode connected to a second node;
a third transistor having a first electrode connected to the first node, a second electrode connected to the third input terminal to which the second power is inputted, and a gate electrode connected to a fourth input terminal to which a second control signal is transmitted;
a fourth transistor having a first electrode connected to the first input terminal to which the first power is transmitted, a second electrode connected to the second node, and a gate electrode connected to the first input terminal;
a fifth transistor having a first electrode connected to the second node, a second electrode connected to the third input terminal, and a gate electrode connected to the first node;
a sixth transistor having a first electrode connected to a fifth input terminal to which the touch clock signal is input, a second electrode connected to a output terminal, and a gate electrode connected to the first node; and
a seventh transistor having a first electrode connected to the output terminal, a second electrode connected to the third input terminal, and a gate electrode connected to the second node.

9. The display apparatus of claim 8, wherein the touch signal generation circuit does not receive the first control signal, the second control signal, and the touch clock signal from the touch drive circuit in a first interval, and receives the first control signal from the touch drive circuit without receiving the second control signal and the touch clock signal in a second interval, and receives the touch clock signal from the touch drive circuit without receiving the first control signal and the second control signal in a third interval, and receives the second control signal from the touch drive circuit without receiving the first control signal and the touch clock signal in a fourth interval.

10. The display apparatus of claim 6, wherein the touch drive circuit supplies a third touch clock signal to a third touch driving line adjacent to the second touch driving line among the plurality of touch driving lines and supplies a fourth touch clock signal to a fourth touch driving line adjacent to the third touch driving line,
wherein the third touch clock signal and the fourth touch clock signal have the same phases as the first touch clock signal and the second touch clock signal respectively, and are output so as to partially overlap with the first touch clock signal and the second touch clock signal.

11. The display apparatus of claim 6, wherein the touch driving signal has a voltage level higher than a voltage level of the touch clock signal.

12. The display apparatus of claim 6, wherein the display panel includes a light emitting layer and an encapsulation for encapsulating the light emitting layer, and the touch sensor part is disposed on the encapsulation.

13. The display apparatus of claim 6, further comprising a control circuit controlling the display drive circuit and the touch drive circuit.

14. A display apparatus having an active area and a non-active area, comprising:
a plurality of pixels connected to gate lines and data lines in the active area;
a plurality of lines disposed in the non-active area and transmitting signals that drive the plurality of pixels;
a gate signal generation circuit disposed in the non-active area and generating a gate signal transmitted to the gate lines;
a touch driver circuit supplying a touch clock signal to a touch signal generation circuit without supplying a touch driving signal to the touch signal generation circuit;
wherein the touch signal generation circuit is disposed at the non-active area, receives the touch clock signal, generates the touch driving signal by using the touch clock signal and outputs the touch driving signal; and
a touch sensor part receiving the touch driving signal and generating touch information on a touch point at the active area, and
wherein the touch sensor part is connected to the touch signal generation circuit through a plurality of touch driving lines,
wherein the touch drive circuit supplies a first touch clock signal to a first touch driving line among the plurality of touch driving lines, and supplies a second touch clock signal to a second touch driving line adjacent to the first touch driving line, and
wherein the first touch clock signal and the second touch clock signal include a first interval having the same phase and a second interval having phases different from each other.

15. The display apparatus of claim 14, wherein the touch signal generation circuit comprises:
a first transistor having a first electrode connected to a first input terminal to which a first power is supplied, a second electrode connected to a first node, and a gate electrode connected to a second input terminal to which a first control signal is transmitted;
a second transistor having a first electrode connected to the first node, a second electrode connected to a third input terminal to which a second power is supplied, and a gate electrode connected to a second node;

a third transistor having a first electrode connected to the first node, a second electrode connected to the third input terminal to which the second power is inputted, and a gate electrode connected to a fourth input terminal to which a second control signal is transmitted;

a fourth transistor having a first electrode connected to the first input terminal to which the first power is transmitted, a second electrode connected to the second node, and a gate electrode connected to the first input terminal;

a fifth transistor having a first electrode connected to the second node, a second electrode connected to the third input terminal, and a gate electrode connected to the first node;

a sixth transistor having a first electrode connected to a fifth input terminal to which the touch clock signal is input, a second electrode connected to a output terminal, and a gate electrode connected to the first node; and a seventh transistor having a first electrode connected to the output terminal, a second electrode connected to the third input terminal, and a gate electrode connected to the second node.

16. The display apparatus of claim 15, wherein the touch signal generation circuit does not receive the first control signal, the second control signal, and the touch clock signal from the touch drive circuit in a first interval, and receives the first control signal from the touch drive circuit without receiving the second control signal and the touch clock signal in a second interval, and receives the touch clock signal from the touch drive circuit without receiving the first control signal and the second control signal in a third interval, and receives the second control signal from the touch drive circuit without receiving the first control signal and the touch clock signal in a fourth interval.

17. The display apparatus of claim 14, wherein the touch drive circuit supplies a third touch clock signal to a third touch driving line adjacent to the second touch driving line among the plurality of touch driving lines and supplies a fourth touch clock signal to a fourth touch driving line adjacent to the third touch driving line, wherein the third touch clock signal and the fourth touch clock signal have the same phases as the first touch clock signal and the second touch clock signal respectively, and are output so as to partially overlap with the first touch clock signal and the second touch clock signal.

18. The display apparatus of claim 14, wherein the touch driving signal has a voltage level higher than a voltage level of the touch clock signal.

* * * * *